United States Patent [19]
Fujita

[11] Patent Number: 5,051,707
[45] Date of Patent: Sep. 24, 1991

[54] GAIN CONTROL CIRCUIT FOR AMPLIFIER HAVING STEPWISE VARIABLE GAIN

[75] Inventor: Tsuneo Fujita, Tokyo, Japan

[73] Assignee: NEC Corporation, Tokyo, Japan

[21] Appl. No.: 300,070

[22] Filed: Jan. 19, 1989

[30] Foreign Application Priority Data

Jan. 19, 1988 [JP] Japan .................................. 63-11360

[51] Int. Cl.$^5$ ............................................. H03G 3/30
[52] U.S. Cl. .................... 330/279; 330/280; 330/282
[58] Field of Search ............... 330/129, 130, 131, 141, 330/278, 279, 307, 280, 281, 282

[56] References Cited

U.S. PATENT DOCUMENTS

| | | | |
|---|---|---|---|
| 4,124,825 | 11/1978 | Webb et al. | 330/279 |
| 4,360,787 | 11/1982 | Galpin | 330/279 X |
| 4,380,737 | 4/1983 | Sanders | 330/279 X |
| 4,492,926 | 1/1985 | Kusakube et al. | 330/280 X |

Primary Examiner—Steven Mottola
Attorney, Agent, or Firm—Helegott & Karas

[57] ABSTRACT

A gain control circuit for an amplifier having a stepwise variable gain is disclosed, which includes a peak detector detecting and holding a peak value of an output voltage of the amplifier, a reference voltage generator generating first and second reference voltages having values different from each other, a comparator circuit comparing the peak value with the first and second reference voltages, and a control circuit responding to a comparison output derived from the comparator circuit and controlling the gain of the amplifier one step by one step such that the peak value becomes to intervene between the first and second reference voltages. When the peak value exists between the first and second reference voltages, the control circuit holds the gain of the amplifier at the current value, so that the amplitude of the output voltage is controlled to be substantially constant.

17 Claims, 3 Drawing Sheets

# GAIN CONTROL CIRCUIT FOR AMPLIFIER HAVING STEPWISE VARIABLE GAIN

BACKGROUND OF THE INVENTION

The present invention relates to a gain-controlled amplifier circuit and, more particularly, to a gain control circuit for an amplifier having a stepwise variable gain.

A gain-controlled amplifier ciruit is basically constructed by an amplifier amplifying an input voltage with a variable gain, a detector detecting an amplitude of an output voltage produced by the amplifier and a control circuit comparing the detected amplitude of the output voltage with a reference voltage for controlling the gain of the amplifier in response to the comparison result such that the detected amplitude becomes equal to the reference voltage.

When an amplifier having a linearly variable gain is employed, the above-mentioned basic construction can control the amplifier such that the amplitude of the amplified output voltage becomes stably equal to a voltage corresponding to the reference voltage. However, if an amplifier varying its gain stepwise is employed, the amplified output voltage changes stepwise with a predetermined voltage step. Therefore, unless the detected amplitude of the output voltage is equal to the reference voltage, the gain continues to be changed. That is, the gain of the amplifier is controlled such that the detected amplitude of the output voltage repeats to become larger or smaller than the reference voltage. The amplitude of the amplified output voltage thereby does not become constant.

SUMMARY OF THE INVENTION

Therefore, an object of the present invention is to provide an improved gain control circuit for an amplifier having a stepwise variable gain.

Another object of the present invention is to provide a gain-controlled amplifier circuit in which an output amplitude of an amplifier having a stepwise variable gain is controlled to become stably constant.

A gain-controlled amplifier circuit according to the present invention comprises an amplifier having a stepwise variable gain and amplifying an input voltage with a gain designated by gain control data, a peak value holding circuit holding a peak value of an output voltage from the amplifier, a reference voltage generator generating first and second voltages having values different from each other, a comparator circuit comparing the peak value with the first and second reference voltages, and a control circuit producing the gain control data in accordance with the output from the comparator circuit to control the gain of the amplifier such that the peak value intervenes between the first and second reference voltages.

It is favorable that the difference voltage between the first and second reference voltages is larger than a voltage change of the peak value of the amplifier output voltage of when the gain of the amplifier is varied by one step but smaller than that when the gain is varied by two step. Thus, the gain of the amplifier is controlled such that the peak value of the output voltage thereof intervenes between the first and second reference voltages, so that the amplitude of the output voltage of the amplfier becomes substantially constant.

BRIEF DESCRIPTION OF THE DRAWINGS

The above and other objects, advantages and features of the present invention will be more apparent from the following description taken in conjunction with the accompanying drawing, in which.

DETAILED DESCRIPTION OF THE EMBODIMENTS

Figure 1:
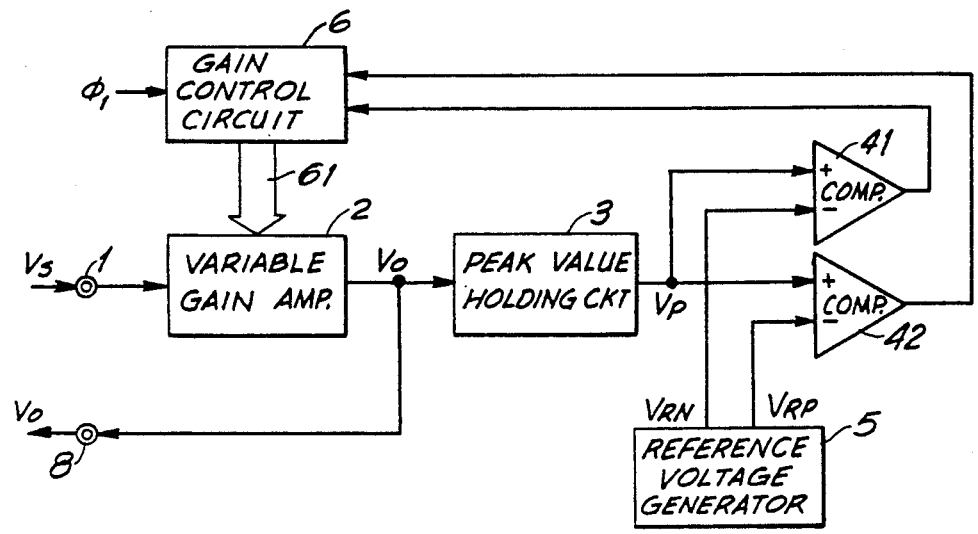
FIG. 1 is a block diagram representative of an embodiment of the present invention.

Referring to FIG. 1, an amplifier 2 has a plurality of gains, one of which is designated by gain control data 61 supplied from a gain control circuit 6. An input voltage $V_s$ is supplied to the amplifier 2 via an input terminal 1. The amplifier 2 amplifies the input voltage $V_s$ with the designated gain and produces an output voltage $V_o$ which is derived from an output terminal 8. The gain control circuit 6 responds to outputs of comparators 41 and 42, which are described later in detail, and changes the gain control data 61 such that the gain of the amplifier 2 is varied one step by one step. When the gain of the amplifier 2 is varied by one step, the amplitude of the output voltage $V_o$ thereof is changed by a predetermined voltage value, this predetermined value being represented by "$V_c$" in the following description.

The output voltage $V_o$ of the amplifier 2 is further supplied to a peak value holding circuit 3 which detects and holds the peak value $V_p$ of the output voltage $V_o$. The peak value $V_p$ is applied in common to the non-inverting input terminals (+) of first and second comparators 41 and 42, the inverting input terminals (−) of which are applied respectively with first and second reference voltages $V_{RN}$ and $V_{RP}$ from a reference voltage generator 5. These reference voltages $V_{RN}$ and $V_{RP}$ have values different from each other, and in this embodiment, the first reference voltage $V_{RN}$ is smaller than the second reference voltage $V_{RP}$. Moreover, the voltage difference between the first and second reference voltages $V_{RN}$ and $V_{RP}$ is designed to be larger than the voltage value $V_c$ and be smaller than the twice value of $V_c$. The peak value $V_p$ is thus compared with the first and second reference voltage $V_{RN}$ and $V_{RP}$ by the comparators 41 and 42. The gain control circuit 6 are supplied with the comparison result from the comparators 41 and 42 and controls the content of the gain control data 61. More specifically, when both of the outputs of the comparators 41 and 42 are at a low level, this means that the peak value $V_p$ is lower than the first reference voltage $V_{RN}$, and therefore the control circuit 6 changes the gain control data 61 such that the gain of the amplifier 2 is incremented one step by one step in synchronism with a first clock signal $\phi_1$. The output voltage $V_o$ of the amplifier 2 is thus increased stepwise by the value of $V_c$. On the other hand, the fact that the comparator 41 produces a high level and the comparator 42 produces the low level, means that the peak value $V_p$ exists between the first and second reference voltages $V_{RN}$ and $V_{RP}$, so that the gain control circuit 6 holds the current content of the gain control data 61. The amplified 2 thereby amplifies the input voltage $V_o$ with the fixed gain. Finally, when both of the outputs of the comparators 41 and 42 are at the high level, this means that the peak value $V_p$ is higher than the reference second reference voltage $V_{RP}$, and hence the control circuit 6 changes the gain control data 61 such that the gain of the amplifier 2 is decremented one step by one step in synchronism with the clock signal $\phi_1$. The output voltage $V_o$ is thus decreased stepwise by the value of $V_c$.

Figure 2:
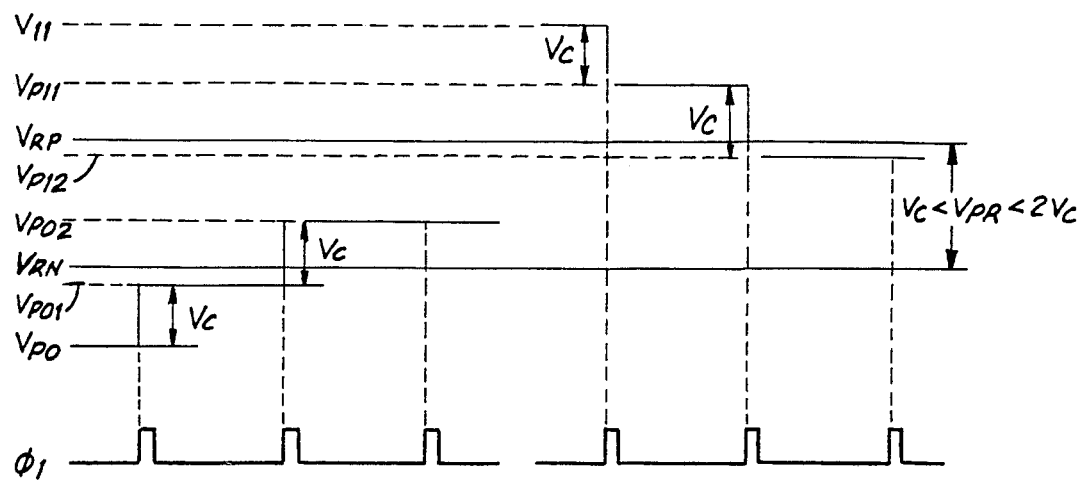
FIG. 2 is a timing chart representative of an operation of a circuit shown in FIG. 1.

Assuming now that, as shown in FIG. 2, the peak value $V_p$ is at a level of $V_{P0}$ that is smaller than the first reference voltage $V_{RN}$, the comparators 41 and 42 both produce the low level. Accordingly, the gain of the amplifier 2 is incremented by one step in response to the changed control data 61 in synchronism with the clock signal $\phi_1$. The output voltage $V_o$ is thereby increased and the peak value $V_P$ takes a level $V_{P01}$ that is higher than the level $V_{P0}$ by the value $V_c$. Since the level $V_{P1}$ is smaller than the first reference voltage $V_{RN}$, the gain control data 61 is further changed by the control circuit 3 to increment the gain of the amplifier 2 by one step. The peak value is thereby changed to a level $V_{P02}$ that is higher than the level $V_{P01}$ by the value of $V_c$. Since this level $V_{P02}$ intervenes between the first and second reference voltages $V_{RN}$ and $V_{RP}$, as shown in FIG. 2, the first comparator 41 produces the high level, the second comparator 42 continues to produce the low level. Therefore, the gain control circuit 6 steps to change the gain control data 61 and holds the current content thereof. So long as the amplitude of the input voltage $V_S$ does not change, the amplifier 2 has the gain designated the hold content of the gain control data 61.

When the amplitude of the input voltage $V_S$ becomes large so that the peak value $V_P$ of the output voltage $V_0$ responsive thereto takes a value $V_{P1}$ that is higher than the second reference voltage $V_{RP}$, as shown in FIG. 2, both of the comparators 41 and 42 produce the high level. Accordingly, the gain control circuit 6 changes the gain control data 61 such that the gain of the amplifier 2 is decremented by one step in synchronism with the clock signal $\phi_1$. The peak value $V_P$ is thereby decreased to a level $V_{P11}$ that is lower than the level $V_{P1}$ by the value of $V_c$. Since this level $V_{P11}$ is still higher than the second reference voltage $V_{RP}$, the gain of the amplifier 2 is further decremented by one step. As a result, the peak value $V_P$ is changed to a level $V_{P12}$ existing between the first and second reference voltages $V_{RN}$ and $V_{RP}$. The current content of the gain control data 61 is thereby held.

Thus, the gain of the amplifier 2 is controlled such that the peak value $V_P$ of the amplified output voltage $V_0$ intervenes between the first and second reference voltages $V_{RN}$ and $V_{RP}$, so that the amplitude of the output voltage $V_0$ becomes substantially constant.

Figure 3:
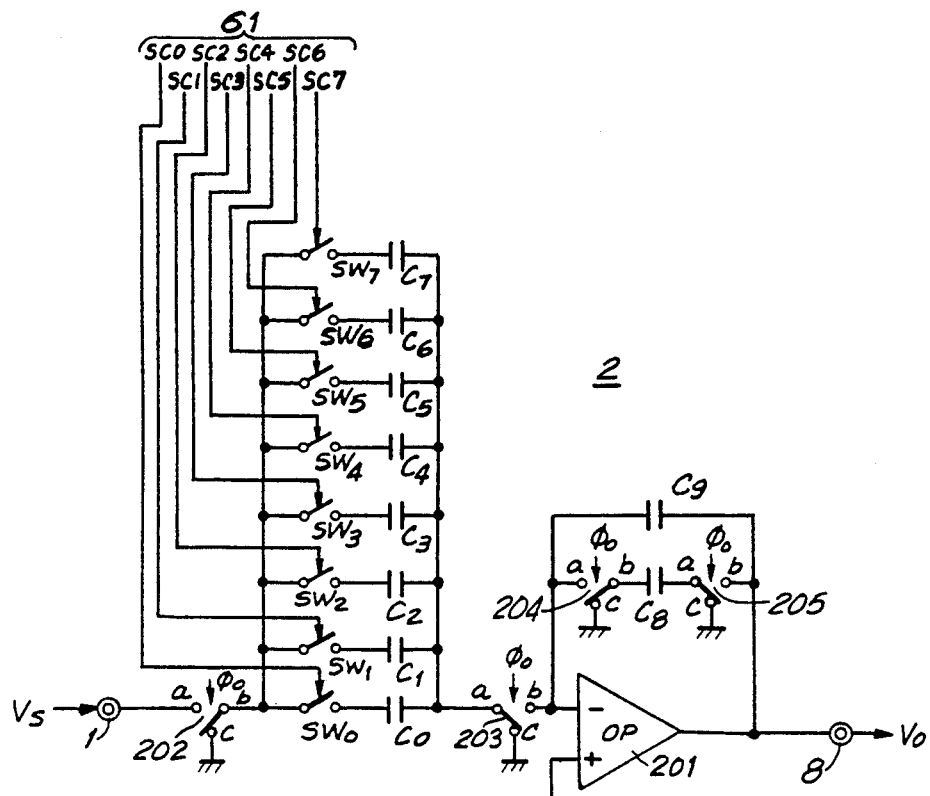
FIG. 3 is a circuit diagram representative of an example of a variable gain amplifier shown in FIG. 1.

Turning to FIG. 3, the stepwise variable gain amplifier 2 shown in FIG. 1 is constructed by a switched capacitor circuit. More specifically, the input terminal 1 is connected via two switch circuits 202 and 203 to the inverting input terminal (−) of an operational amplifier 201 whose non-inverting input terminal (+) is connected to a ground terminal. Inserted in parallel between the switch circuits 202 and 203 are eight series-connection circuits of a pair of a switch and a capacitor, $SW_0$ and $C_0$, $SW_1$ and $C_1$, $SW_2$ and $C_2$, $SW_3$ and $C_3$, $SW_4$ and $C_4$, $SW_5$ and $C_5$, $SW_6$ and $C_6$, $SW_7$ and $C_7$. The gain control data 61 from the control circuit 6 consists of eight bits $SC0$ to $SC7$, and one or more of the switches $SW_0$ to $SW_7$ are turned ON in response to the contents $SC0$ to $SC7$ of the gain control data 61. The output of the operational amplifier 201 is connected to the terminal 8 and to the peak value holding circuit 3. Connected between the inverting input and output terminals of the operational amplifier 201 are a capacitor $C_9$ and a series connection of two switch circuits 204 and 205 and a capacitor $C_8$. Each of the switch circuits 202 to 205 has first and second contact nodes a and b and a reference node c connected to the ground and is controlled by a sampling clock signal $\phi_0$. When the sampling clock signal $\phi_0$ is at the high level, the second contact node b and the reference node c in the switch circuits 202 and 204 are connected to each other and the first contact node a and the reference node c in the switch circuits 203 and 205 are connected to each other. On the other hand, the first contact node a and the second contact note b in each of the switch circuits 202 to 205 are connected to each other when the clock $\phi_0$ is at the low level. Assume that the total capacitance value of one or more capacitors $C_0$ to $C_7$ which are connected in parallel via the turned-ON switch or switches $SW_0$ to $SW_7$ is represented by "$C_{IN}$" and the capacitance values of the capacitors $C_8$ and $C_9$ are represented by "$C_{F1}$" and "$C_{F2}$", respectively. Further assume that the clock rate of the sampling clock signal $\phi_0$ is represented by $f_s$. The transfer function $G(S)$ of the amplifier 2 shown in FIG. 3 is thereby represented by the following equation (1).

$$G(S) = \frac{C_{IN}}{C_{F1}} \cdot \frac{1}{1 + s\frac{C_{F2}}{C_{F1}} \cdot \frac{1}{f_s}} \quad (1)$$

Therefore, the gain of the amplifier 2 can be controlled stepwise by the content of the gain control data 61 and the capacitance value of each of the capacitors $C_0$ to $C_8$. The clock rate of the sampling clock $\phi_0$ is designed to be extremely higher than that of the first clock signal $\phi_1$.

Figure 4:
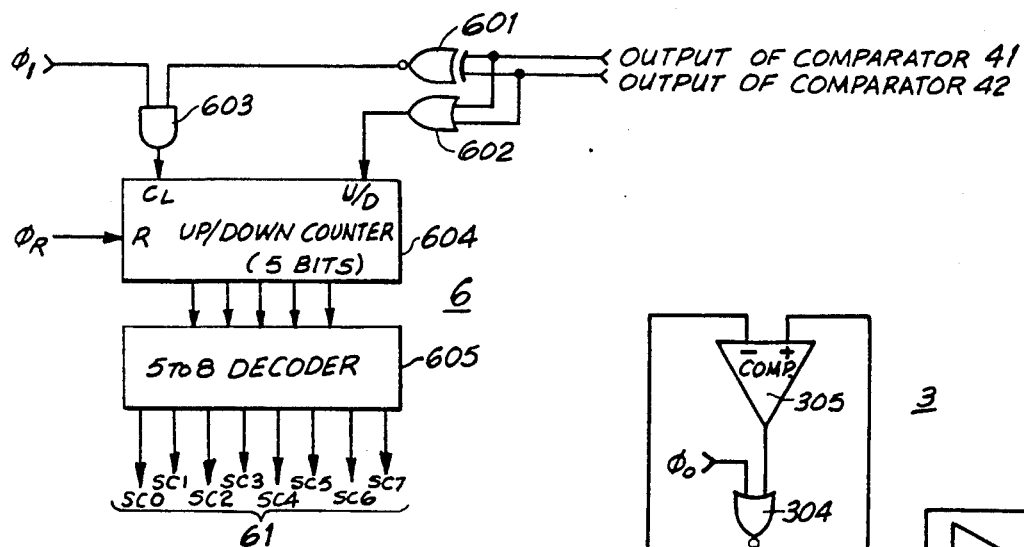
FIG. 4 is a circuit diagram representative of an example of a gain control circuit shown in FIG. 1.

Referring to FIG. 4, the gain control circuit 6 includes a five-bits up/down counter 604 which operates as a up counter when the low level is supplied to its a up/down control terminal U/D and increments the content thereof by one in synchronism with the clock pulse applied to a clock terminal CL. The counter 604 operates as a down counter when the high level is supplied to the terminal U/D and decrements the content by one in synchronism with the pulse applied to the terminal CL. The logic level at the terminal U/D is controlled by an OR gate 602 supplied with the outputs of the comparators 41 and 42. The supply of the pulse to the terminal CL is controlled by an AND gate 603 receiving the clock signal $\phi_1$ and an output of an exclusive NOR gate (EX-NOR gate) 601 supplied with the outputs of the comparators 41 and 42. Therefore, when the peak value $V_P$ is smaller than the first reference value $V_{RN}$, the counter 604 increments the content there of whenever the clock signal $\phi_1$ is supplied. When the peak value $V_P$ is higher than the second reference value $V_{RP}$, the counter 604 decrements the content thereof in response to the clock signal $\phi_1$. When the peak value $V_P$ intervenes between the first and second reference voltages $V_{RN}$ and $V_{RP}$, the clock signal $\phi_1$ is inhibited to be applied to the terminal CL by the AND gate, so that the counter 604 holds the current content. In response to the content of the counter 604, i.e. five bits output data, a five-to-eight decoder 605 produces the gain control data 61 consisting of eight bits SC0 to SC7. In an initial state such as a power switching-on, a reset signal $\phi_R$ is supplied to a reset terminal R of the counter 604, so that the content of the counter 604 takes a value of "00000". This value is supplied to the decoder 605, and hence the gain control data 61 take such a content that the amplifier 2 has a center gain. In this state, if the counter 604 operates as the up counter, the content thereof is changed to be "00001"→"00010"→"00011"→"00100"→ . . . , every when the clock $\phi_1$ is applied. On the other hand, when the counter operates as the down counter, the content thereof is changed to be "11111"→"11110"→"11101"→"11100"→ . . . , in response to the clock $\phi_1$. As a result, the control circuit 6 changes the gain control data 61 such that the peak value $V_P$ becomes to intervene between the first and second reference voltages $V_{RN}$ and $V_{RP}$ and holds the current content of the gain control data 61 when the peak value $V_P$ exists between therebetween.

Figure 5:
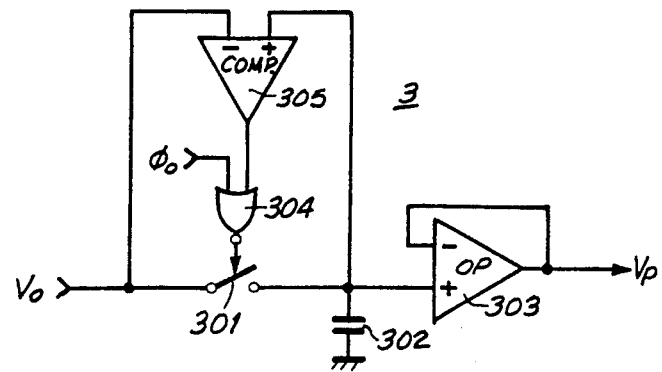
FIG. 5 is a circuit diagram representative of an example of a peak value holding circuit shown in FIG. 1.

Turning to FIG. 5, the peak value holding circuit 3 includes an operational amplifier 303 having a non-inverting input terminal (+) supplied with the output voltage $V_0$ via a switch 301. The output of the operational amplifier 303 is derived as the peak value $V_P$ and is directly fed back to its inverted input terminal (−) to operates as a voltage-follower. A capacitor 302 is connected between the terminal (+) and the ground and operates as a voltage holding capacitor. The voltage $V_0$ is compared by a comparator 305 with the voltage across the capacitor 302, and the comparison result is supplied to a NOR gate 304 receiving the sampling clock signal $\phi_0$ indicated in FIG. 3. The output of the NOR gate 304 controls the switch 301. Accordingly, the switch 301 is turned ON when the sampling clock signal is at the low level and when the output voltage $V_0$ is higher than the previously sampled and held peak value $V_P$. Thus, the circuit 3 detects and holds the peak value of the output voltage $V_0$ from the amplifier 2. The reference voltage generator 5 can be constituted by a resistor-divided circuit, for example.

Figure 6:
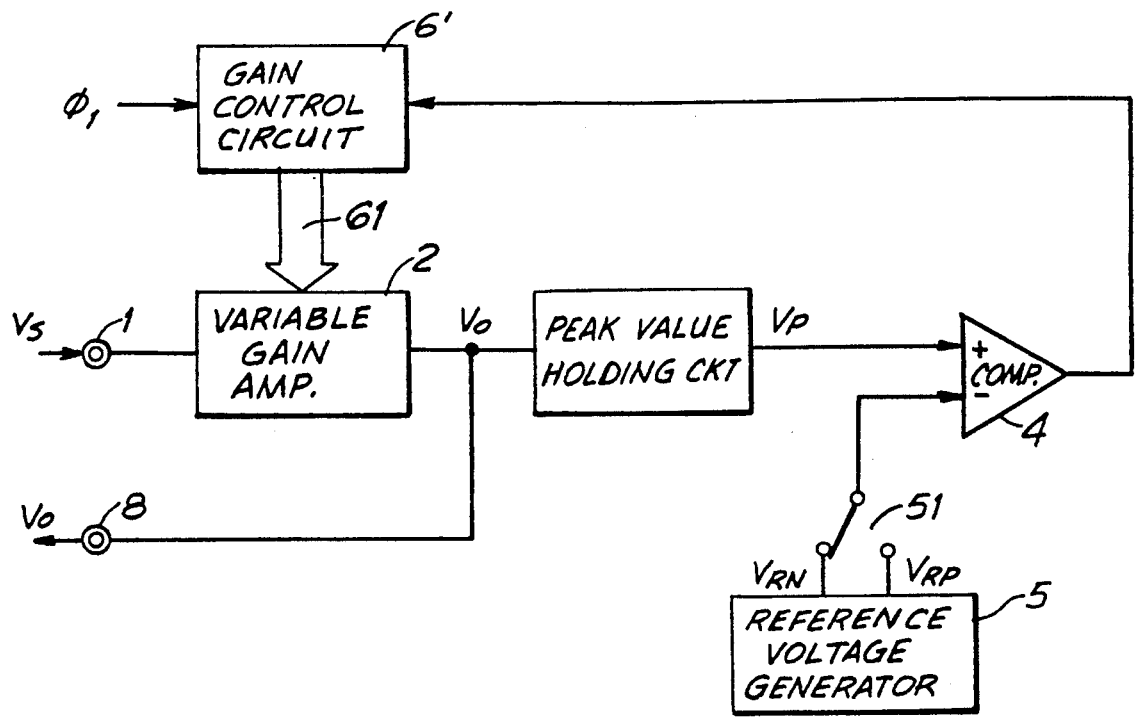
FIG. 6 is a block diagram representative of another embodiment of the present invention.

Since the gain control circuit 3 requires only the outputs of the comparators 41 and 42 just before the supply of the first clock signal $\phi_1$, the comparator 41 and 42 can be replaced by one comparator. This circuit construction is shown in FIG. 6 as another embodiment of the present invention, in which the same constituents as those shown in FIG. 1 are denoted by like reference numerals to omit further description thereof. In FIG. 6, a comparator 4 is used for the first and second comparators 41 and 42 of FIG. 1. The non-inverting input terminal (+) of the comparator 4 is supplied with the peak value $V_P$ and the inverting input terminal (−) thereof is supplied alternately with the first and second reference voltages $V_{RN}$ and $V_{RP}$ through a switch circuit 51. The control circuit 6' at first latches the comparison output of the peak value $V_P$ and the first reference voltage $V_{RN}$. The switch circuit 51 is thereafter changed over. The control circuit 6' thereby latches the comparison output of the peak value $V_P$ and the second reference voltage $V_{RP}$. Therefore, the circuit as shown in FIG. 6 performs the same operation and effect as the circuit shown in FIG. 1.

Figure 7:
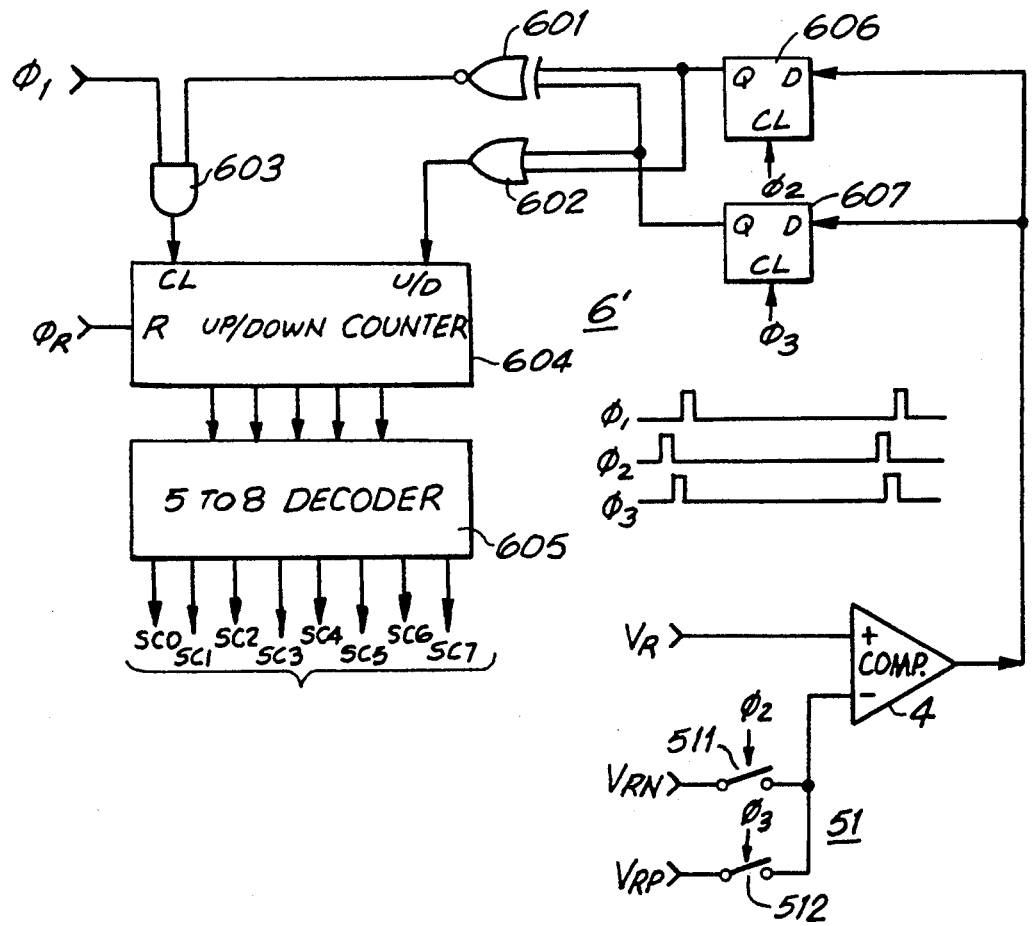
FIG. 7 is a circuit diagram representative of a gain control circuit and a switch circuit shown in FIG. 6.

Turning to FIG. 6, the control circuit 6' shown in FIG. 7 further includes two D-type flip-flops 606 and 607 in addition to the gates 601 to 603, counter 604 and decoder 605. The first flip-flop 606 latches the output of the comparator 4 in synchronism with a second clock signal $\phi_2$, and the second flip-flop 607 latches the output of the comparator 4 in synchronism with a third clock signal $\phi_3$. The switch circuit 51 is constituted of two switches 511 and 512 controlled by the second and third clock signals $\phi_2$ and $\phi_3$, respectively. As shown in FIG. 7, the second and third clock signals $\phi_2$ and $\phi_3$ are supplied just before the first clock signal $\phi_1$ with the different phases from each other. Thus, one comparator 4, two flip-flops 606 and 607 and two switches 511 and 512 attains the same result as two comparators 41 and 42 shown in FIG. 1.

The present invention is not limited to the above embodiments, but may be modified and changed without departing from the scope and spirit of the invention. For example, the amplifier 2 can be constitute of a static-type amplifier, in which the capacitors $C_0$ to $C_8$ are replaced by the corresponding resistors. In this case, the switch circuits 202 to 205 and the capacitor $C_9$ are not required.

What is claimed is:

1. An amplifier circuit comprising an amplifier having a stepwise variable gain and amplifying an input voltage with a gain designated by a gain control data, a peak value holding circuit for detecting a peak value of an output voltage derived from said amplifier and holding said peak value when said peak value is greater than a previously held peak value, means for generating a first reference voltage and a second reference voltage having a value different from said first reference voltage, comparison means for comparing the peak value held by said peak value holding circuit with said first reference voltage and said second reference voltage, control means responsive to a comparison output of said comparison means for controlling said gain control data such that the peak value held by said peak value holding circuit exists between said first and second reference voltages, whereby the gain of said amplifier is fixed as long as the peak value currently held by said peak value holding circuit is between said first and second reference voltages irrespective of a change in an amplitude of said input voltage.

2. The circuit as claimed in claim 1, wherein a voltage difference between said first and second reference voltages is greater than a one step change in the peak value when the gain of said amplifier is varied by one step.

3. The circuit as claimed in claim 2, wherein said voltage difference is smaller than twice said one step change in the peak value.

4. The circuit as claimed in claim 1, wherein a value of said second reference voltage is higher than a value of said first reference voltage and said comparison means produces a first comparison output when the peak value held by said peak value holding circuit is smaller than said first reference voltage, a second comparison output when the peak value held by said peak value holding circuit is between said first and second reference voltages and a third comparison output when the peak value held by said peak value holding circuit is greater than said second reference voltage, said control means changing the content of gain control data such that the gain of said amplifier is increased in response to said first comparison output, holding the content of said gain control data in response to said second comparison output and changing the content of said gain control data such that the gain of said amplifier is decreased in response to said third comparison output.

5. The circuit as claimed in claim 4, wherein said comparison means includes a first comparator supplied with said peak value and said first reference voltage and a second comparator supplied with said peak value and said second reference voltage.

6. The circuit as claimed in claim 4, wherein said comparison means includes a comparator having a first terminal supplied said peak value and a second terminal supplied alternately with said first and second reference voltages.

7. A gain-controlled amplifier circuit comprising an amplifier, a control circuit controlling a gain of said amplifier, said amplifier amplifying an input voltage with the controlled gain to produce an output voltage, said control circuit including means responsive to first data for incrementing the gain of said amplifier one step by one step, means responsive to second data for holding the gain of said amplifier at a current value and means responsive to third data for decrementing the gain of said amplifier one step by one step, a a peak value holding circuit for detecting a peak value of said output voltage and holding said peak value when said peak value is greater than a currently held peak value, a reference voltage generator generating a first reference voltage and a second reference voltage that is higher than said first reference voltage, and a circuit means for comparing the peak value held by said peak value holding circuit with said first reference voltage and said second reference voltage and for producing said first data when the peak value held by said peak value holding circuit is smaller than said first reference voltage, for producing said second data when said peak value held by said peak value holding circuit is between said first reference voltage and said second reference voltage and producing said third data when said peak value held by said peak value holding circuit is greater than said second reference voltage, whereby the gain of said amplifier is held at the current gain as long as the peak value currently held by said peak holding circuit is between said first and second reference voltages irrespective of a change in an amplitude of said input voltage.

8. The circuit as claimed in claim 7, wherein said control circuit controls the gain of said amplifier in synchronism with a first clock and said detection circuit detects the amplitude of said output voltage in synchronism with a second clock, said second clock having a clock rate higher than the clock rate of said first clock.

9. The circuit as claimed in claim 7, wherein said circuit means includes a first comparator comparing said detected voltage with said first reference voltage, a second comparator comparing said detected voltage with said second reference voltage and means responsive to outputs of said first and second comparators for producing one of said first, second and third data.

10. The circuit as claimed in claim 7, wherein said circuit means includes a comparator having first and second input nodes, means for supplying said detected voltage to said first input node, means for supplying said first reference voltage to said second input node in a first state, means for supplying said second reference voltage to said second input node in a second state, means activated in said first state for latching an output of said comparator, means activated in said second state for latching the output of said comparator, and means responsive to contents of said two latching means for producing one of said first, second and third data.

11. An amplifier circuit comprising an amplifier having a stepwise variable gain and amplifying an input voltage with a gain designated by a gain control data, means for detecting and holding a peak value of an output voltage derived from said amplifier, means for generating a first reference voltage and a second reference voltage having a value different from said first reference voltage, comparison means for comparing said peak value with said first reference voltage and said second reference voltage, control means responsive to a comparison output of said comparison means for controlling said gain control data such that said peak value exists between said first and second reference voltages,
wherein said comparison means includes a first comparator supplied with said peak value and said first reference voltage and a second comparator supplied with said peak value and said second reference voltage.

12. An amplifier circuit comprising an amplifier having a stepwise variable gain and amplifying an input voltage with a gain designated by a gain control data, means for detecting and holding a peak value of an output voltage derived from said amplifier, means for generating a first reference voltage and a second reference voltage having a value different from said first reference voltage, comparison means for comparing said peak value with said first reference voltage and said second reference voltage, control means responsive to a comparison output of said comparison means for controlling said gain control data such that said peak value exists between said first and second reference voltages,
wherein said comparison means includes a comparator having a first terminal supplied with said peak value and a second terminal supplied alternately with said first and second reference voltages.

13. A gain-controlled amplifier circuit comprising an amplifier, a control circuit controlling a gain of said amplifier, said amplifier amplifying an input voltage with the controlled gain to produce an output voltage, said control circuit including means responsive to first data for incrementing the gain of said amplifier one step by one step, means responsive to second data for holding the gain of said amplifier at a current value and means responsive to third data for decrementing the gain of said amplifier one step by one step, a detection circuit detecting an amplitude of said output voltage and producing a detected voltage responsive to the amplitude of said output voltage, a reference voltage generator generating a first reference voltage and a second reference voltage that is higher than said first reference voltage, and circuit means for comparing said detected voltage with said first reference voltage and said second reference voltage and for producing said first data when said detected voltage is smaller than said first reference voltage, producing said second data when said detected voltage is between said first and second reference voltages and producing said third data when said detected voltage is greater than said second reference voltage,
wherein said control circuit controls the gain of said amplifier in synchronism with a first clock and said detection circuit detects the amplitude of said output voltage in synchronism with a second clock, said second clock having a clock rate higher than the clock rate of said first clock.

14. A gain-controlled amplifier circuit comprising an amplifier, a control circuit controlling a gain of said amplifier, said amplifier amplifying an input voltage with the controlled gain to produce an output voltage, said control circuit including means responsive to first data for incrementing the gain of said amplifier one step by one step, means responsive to second data for holding the gain of said amplifier at a current value and means responsive to third data for decrementing the gain of said amplifier one step by one step, a detection circuit detecting an amplitude of said output voltage and producing a detected voltage responsive to the amplitude of said output voltage, a reference voltage generator generating a first reference voltage and a second reference voltage that is higher than said first reference voltage, and circuit means for comparing said detected voltage with said first reference voltage and said second reference voltage and for producing said first data when said detected voltage is smaller than said first reference voltage, producing said second data when said detected voltage is between said first and second reference voltages and producing said third data when said detected voltage is greater than said second reference voltage, wherein said circuit means includes a first comparator comparing said detected voltage with said first reference voltage, a second comparator comparing said detected voltage with said second reference voltage, and means responsive to outputs of said first and second comparators for producing one of said first, second and third data.

15. A gain-controlled amplifier circuit comprising an amplifier, a control circuit controlling a gain of said amplifier, said amplifier amplifying an input voltage with the controlled gain to produce an output voltage, said control circuit including means responsive to first data for incrementing the gain of said amplifier one step by one step, means responsive to second data for holding the gain of said amplifier at a current value and means responsive to third data for decrementing the gain of said amplifier one step by one step, a detection circuit detecting an amplitude of said output voltage and producing a detected voltage responsive to the amplitude of said output voltage, a reference voltage generator generating a first reference voltage and a second reference voltage that is higher than said first reference voltage, and circuit means for comparing said detected voltage with said first reference voltage and said second reference voltage and for producing said first data when said detected voltage is smaller than said first reference voltage, producing said second data when said detected voltage is between said first and second reference voltages and producing said third data when said detected voltage is greater than said second reference voltage, wherein said circuit means includes a comparator having first and second input nodes, means for supplying said detected voltage to said first input node, means for supplying said first reference voltage to said second input node in a first state, means for supplying said second reference voltage to said second input node in a second state, means activated in said first state for latching an output of said comparator, means activated in said second state for latching the output of said comparator, and means responsive to contents of said two latching means for producing one of said first, second and third data.

16. An amplifier circuit comprising an input terminal supplied with an input voltage, an amplifier having a stepwise variable gain, said amplifier being coupled to said input terminal for amplifying said input voltage with a gain designated by a gain control data, means for detecting and holding a peak value of an output voltage derived from said amplifier, means for generating a first reference voltage and a second reference voltage having a value different from said first reference voltage, comparison means for comparing said peak value with said first reference voltage and said second reference voltage, control means responsive to a comparison output of said comparison means for controlling said gain control data such that said peak value exists between said first and second reference voltages, said amplifier including an operational amplifier and a plurality of input circuits connected in parallel between said input terminal and an input node of said operational amplifier, each of said input circuits having switching means and impedance means connected in series, and said gain control data consisting of digital codes for turning ON the switching means in at least one selected input circuit of said input circuits and turning OFF the switching means in at least one remaining one of said input circuits.

17. The circuit as claimed in claim 16, wherein said impedance means comprises a capacitor.

* * * * *